United States Patent
Bekele et al.

(10) Patent No.: US 10,715,153 B1
(45) Date of Patent: Jul. 14, 2020

(54) MULTI-PORT INDUCTORS AND TRANSFORMERS FOR ACCURATELY PREDICTING VOLTAGE-CONTROLLED OSCILLATOR (VCO) FREQUENCY

(71) Applicant: XILINX, INC., San Jose, CA (US)

(72) Inventors: Adebabay M. Bekele, San Jose, CA (US); Parag Upadhyaya, Los Gatos, CA (US); Didem Z. Turker Melek, San Jose, CA (US); Jing Jing, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/517,103

(22) Filed: Jul. 19, 2019

(51) Int. Cl.
| | |
|---|---|
| *H03L 7/099* | (2006.01) |
| *H03C 3/09* | (2006.01) |
| *H03L 7/183* | (2006.01) |

(52) U.S. Cl.
CPC .......... *H03L 7/099* (2013.01); *H03C 3/0958* (2013.01); *H03L 7/183* (2013.01)

(58) Field of Classification Search
CPC ........ H03L 7/099; H03L 7/183; H03C 3/0958
USPC ........................................ 327/156, 158, 161
See application file for complete search history.

(56) References Cited

U.S. PATENT DOCUMENTS

| | | | |
|---|---|---|---|
| 6,742,167 B2 | 5/2004 | Grau | |
| 7,154,349 B2 | 12/2006 | Cabanillas | |
| 9,093,950 B2 | 7/2015 | Ashckenazi et al. | |
| 2008/0266011 A1* | 10/2008 | Kuosmanen | H03L 5/00 331/175 |
| 2016/0322979 A1 | 11/2016 | Upadhyaya et al. | |
| 2019/0379384 A1* | 12/2019 | Aude | H03B 5/1265 |

OTHER PUBLICATIONS

Samuel Lightbody, Transformer-enhanced High-performance Voltage-controlled Oscillators, Thesis, Aug. 2018, 50 pages, Vancouver, CA.
Didem Turker, Ade Bekele, Parag Upadhyaya, Bob Verbruggen, Ying Cao, Shaojun Ma, Christophe Erdmann, Brendan Farley, Yohan Frans, and Ken Chang, A 7.4-to-14GHz PLL with 54fsrms Jitter in 16nm FinFET for Integrated RF-Data-Converter SoCs, ISSCC 2018 / Session 23 / LO Generation / 23.7, 2018, IEEE International Solid-State Circuits Conference, 2 pages, San Francisco, US.

(Continued)

*Primary Examiner* — John W Poos
(74) *Attorney, Agent, or Firm* — Patterson + Sheridan, LLP

(57) ABSTRACT

Apparatus and associated methods relate to automatically generating a data structure representation of an on-chip inductive-capacitive (LC) tank circuit by determining parasitic inductances in each of the segments of conductive paths that connect a main inductor to one or more selectable VCO components such as capacitors and varactors, for example. In an illustrative example, one or more of the selectable VCO components may be arranged, when selected, to form a parallel resonant LC tank with the main inductor. A method may include defining nodes $a_i$ terminating each of the segments along the conductive paths between the main inductor terminals and a drive circuit. By modelling the paths as multi-port inductors and transformers, resonant frequency of the VCO may be more accurately predicted by simulation.

20 Claims, 11 Drawing Sheets

(56) References Cited

OTHER PUBLICATIONS

V. Macaitis, V. Barzdenas, and R. Navickas, Design of 4.48-5.89 GHz LC-VCO in 65 nm RF CMOS Technology, Elektronika Ir Elektrotechnika, ISSN 1392-1215, vol. 20, No. 2, 2014, Vilnius, Lithuania.

* cited by examiner

US 10,715,153 B1

MULTI-PORT INDUCTORS AND TRANSFORMERS FOR ACCURATELY PREDICTING VOLTAGE-CONTROLLED OSCILLATOR (VCO) FREQUENCY

TECHNICAL FIELD

Various embodiments relate generally to circuits, and more specifically to voltage-controlled oscillators (VCOs).

BACKGROUND

Modern networks are responsible for interconnecting computing devices operable to exchange data. Data may be exchanged from circuit to circuit on a common circuit board or from circuit board to circuit board along a common backplane, for example, in a computer or server. In some implementations, data may be exchanged over long distances, for example, from a travel agent's computer to an airline server on a cloud network.

Data can be transferred in the form of digital (e.g., bits and bytes) or analog (e.g., radio frequency (RF)) signals. Data communication systems may physically transfer the data from transmitter to receiver via wired and/or wireless links. Further, some data communication systems may need to operate within one or more frequency bands to match a transmit frequency to a receive frequency.

Some transmit or receive circuits that operate over a range of frequencies may use a phase-locked loop (PLL). In general, a PLL may be a frequency control circuit that generates an output signal whose phase is related to the phase of an input signal. A PLL may be formed from a frequency oscillator (e.g., a voltage-controlled oscillator (VCO)) coupled with a phase detector in a feedback loop. The oscillation frequency of the VCO may be varied by adjusting a variable capacitor within the VCO. A VCO may be an inductor-capacitor VCO (LC VCO) or a transformer-capacitor VCO (TC VCO). The inductor or the transformer may affect the oscillation frequency of the VCOs.

SUMMARY

Apparatus and associated methods relate to automatically generating a data structure representation of an on-chip inductive-capacitive (LC) tank circuit by determining parasitic inductances in each of the segments of conductive paths that connect a main inductor to one or more selectable VCO components such as capacitors and varactors, for example. In an illustrative example, one or more of the selectable VCO components may be arranged, when selected, to form a parallel resonant LC tank with the main inductor. A method may include defining nodes $a_i$ terminating each of the segments along the conductive paths between the main inductor terminals and a drive circuit. By modelling the paths as multi-port inductors and transformers, resonant frequency of the VCO may be more accurately predicted by simulation.

Various embodiments may achieve one or more advantages. For example, accurately modeling frequency band overlap between successive frequency bands may help a designer choose appropriate varactor size, thus footprint (e.g., size) of the VCO may advantageously be reduced. Some embodiments may substantially reduce errors that may be associated with, for example, temperature drift. In some implementations, the appropriate varactor size may provide enough tuning range that allows the VCO to substantially mitigate temperature drift. Some embodiments may help a PLL to meet, for example, phase noise and maximum frequency specifications. Some embodiments may help a PLL to meet functional requirement of, for example, staying locked during temperature drift. Multi-port modeling may be used to accurately predict frequency band overlap and thus optimize various system requirements, such as minimum and maximum frequencies, phase noise, and temperature drift compensations, for example. By accurately predicting frequency before taping out, some embodiments may substantially reduce or avoid putting in extra margin to cover frequency inaccuracies that come from inaccurate prediction, and thus, power consumption of VCO and/or PLL may be advantageously reduced, and noise performance of the VCO and/or PLL may be advantageously improved, for example. Some embodiments may make the PLL achieve desired operating frequencies, and thus, link in a communication system may work at that rate to meet certain communication standards and/or protocols. By accurately predicting the frequency of VCO, re-tape out of the chip after retuning the inductor (and/or transformer) and design may be advantageously reduced or avoided and thus, the number of tape out iterations needed and chip tape out expenses may be reduced.

In one exemplary aspect, a method includes: (a) providing a circuit model representative of an oscillator circuit (OC). The OC includes (1) an inductor, (2) a drive circuit, (3) a first conductive path extending between a first terminal of the inductor and a first terminal of the drive circuit, (4) a second conductive path extending between a second terminal of the inductor and a second terminal of the drive circuit, and (5) N selectively connectable capacitor arrays, that, when selected, provides a corresponding capacitance between the first conductive path at an $a_i$ node and the second conductive path at a $b_i$ node, $i \geq 1$. The method also includes (b) receiving parameter information associated with a parasitic inductance $L_{1,i}$ in the first conductive path between the $a_i$ node and an $a_{i-1}$ node, (c) determining the parasitic inductance $L_{1,i}$ in the first conductive path between the $a_i$ node and the $a_{i-1}$ node, (d) incrementing i and repeat (b) to (c) until i=N, and, (e) generating a data structure model representative of the OC modified to include $L_{1,i}$ in the first conductive path between the $a_i$ node and an $a_{i-1}$ node.

In some embodiments, the method may also include (f1) receiving parameter information associated with a parasitic inductance $L_{2,i}$ in the second conductive path between the $b_i$ node and a $b_{i-1}$ node, (g1) determining the parasitic inductance $L_{2,i}$ in the second conductive path between the $b_i$ node and the $b_{i-1}$ node, (h1) incrementing i and repeat (b) to (c) until i=N, and, (i1) updating the data structure model representative of the OC modified to further include $L_{2,i}$ in the second conductive path between the $b_i$ node and the $b_{i-1}$ node.

In some embodiments, the method may also include (f2) copying the inductance $L_{1,i}$ in the first conductive path between the $a_i$ node and the $a_{i-1}$ node to form a corresponding inductance $L_{2,i}$ in the second conductive path between a corresponding $b_i$ node and $b_{i-1}$ node, and (g2) updating the data structure model representative of the OC modified to further include $L_{2,i}$ in the first conductive path between the $b_i$ node and $b_{i-1}$ node. In some embodiments, receiving parameter information may include receiving position and inductance of the inductor. In some embodiments, receiving parameter information may also include receiving position and number of connection nodes between the inductor and each of the capacitor arrays.

In some embodiments, the data structure may be arranged as a netlist associated with nodes. In some embodiments, each of the N selectively connectable capacitor arrays may be enabled in response to a corresponding control signal. In some embodiments, the inductor may include at least a portion of a transformer winding. In some embodiments, the OC may also include a varactor circuit coupled between the first conductive path and the second conductive path. In some embodiments, the oscillator circuit may include a voltage-controlled oscillator (VCO). In some embodiments, the drive circuit may include two cross-coupled transistors, each source terminal of the two cross-coupled transistors is connected to a current control circuit.

In another exemplary aspect, a system includes (a) a processor; (b) a first data store coupled to the processor and configured to store circuit models of an oscillator circuit (OC) and parameter information associated with a corresponding circuit model; and (c) a second data store coupled to the processor and containing a program of instructions that, when executed by the processor, cause the processor to perform operations to model frequency characteristics of the OC. The operations include (c1) receiving a circuit model representative of an oscillator circuit (OC). The OC includes (1) an inductor, (2) a drive circuit, (3) a first conductive path extending between a first terminal of the inductor and a first terminal of the drive circuit, (4) a second conductive path extending between a second terminal of the inductor and a second terminal of the drive circuit, and (5) N selectively connectable capacitor arrays, that, when selected, provides a corresponding capacitance between the first conductive path at an $a_i$ node and the second conductive path at a $b_i$ node, i≥1. The operations also include (c2) (c2) receiving parameter information associated with a parasitic inductance $L_{1,i}$ in the first conductive path between the $a_i$ node and an $a_{i-1}$ node, (c3) determining the parasitic inductance $L_{1,i}$ in the first conductive path between the $a_i$ node and the $a_{i-1}$ node, (c4) incrementing i and repeat (c2) to (c3) until i=N, and, (c5) generating a data structure model representative of the OC modified to include $L_{1,i}$ in the first conductive path between the $a_i$ node and an $a_{i-1}$ node.

In some embodiments, the operations may also include: (d1) receiving parameter information associated with a parasitic inductance $L_{2,i}$ in the second conductive path between the $b_i$ node and a $b_{i-1}$ node, (e1) determining the parasitic inductance $L_{2,i}$ in the second conductive path between the $b_i$ node and the $b_{i-1}$ node, (f1) incrementing i and repeat (d1) to (e1) until i=N, and, (g1) updating the data structure model representative of the OC modified to further include $L_{2,i}$ in the second conductive path between the $b_i$ node and the $b_{i-1}$ node.

In some embodiments, the operations may also include: (d2) copying the inductance $L_{1,i}$ in the first conductive path between the $a_i$ node and the $a_{i-1}$ node to form a corresponding inductance $L_{2,i}$ in the second conductive path between a corresponding $b_i$ node and $b_{i-1}$ node, and (e2) updating the data structure model representative of the OC modified to further include $L_{2,i}$ in the first conductive path between the $b_i$ node and $b_{i-1}$ node. In some embodiments, receiving parameter information may include receiving position and inductance of the inductor. In some embodiments, receiving parameter information may also include receiving position and number of connection nodes between the inductor and each of the capacitor arrays.

In some embodiments, the data structure may be arranged as a netlist associated with nodes. In some embodiments, each of the N selectively connectable capacitor arrays may be enabled in response to a corresponding control signal. In some embodiments, the inductor may include at least a portion of a transformer winding. In some embodiments, the OC may also include a varactor circuit coupled between the first conductive path and the second conductive path. In some embodiments, the oscillator circuit may include a voltage-controlled oscillator (VCO).

In some embodiments, the drive circuit may include two cross-coupled transistors, each source terminal of the two cross-coupled transistors is connected to a current control circuit.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to automatically generating a data structure representation of an on-chip inductive-capacitive (LC) tank circuit by determining parasitic inductances in each of the segments of conductive paths that connect a main inductor to one or more selectable VCO components such as capacitors and varactors, for example. In an illustrative example, one or more of the selectable VCO components may be arranged, when selected, to form a parallel resonant LC tank with the main inductor. A method may include defining nodes a; terminating each of the segments along the conductive paths between the main inductor terminals and a drive circuit. By modelling the paths as multi-port inductors and transformers, resonant frequency of the VCO may be more accurately predicted by simulation.

To aid understanding, this document is organized as follows. First, an exemplary platform (e.g., an FPGA) suitable to perform data conversion and clock generation is briefly introduced with reference to FIG. 1. Second, with reference to FIGS. 2A-5C, the discussion turns to exemplary embodiments that illustrate schematic modeling of inductors and possible applications of the inductor. Then, with reference to FIGS. 6A-6B, exemplary methods to model the inductor are discussed in detail. Finally, with reference to FIG. 7, further explanatory simulation results of different modeling methods are presented.

Figure 1:
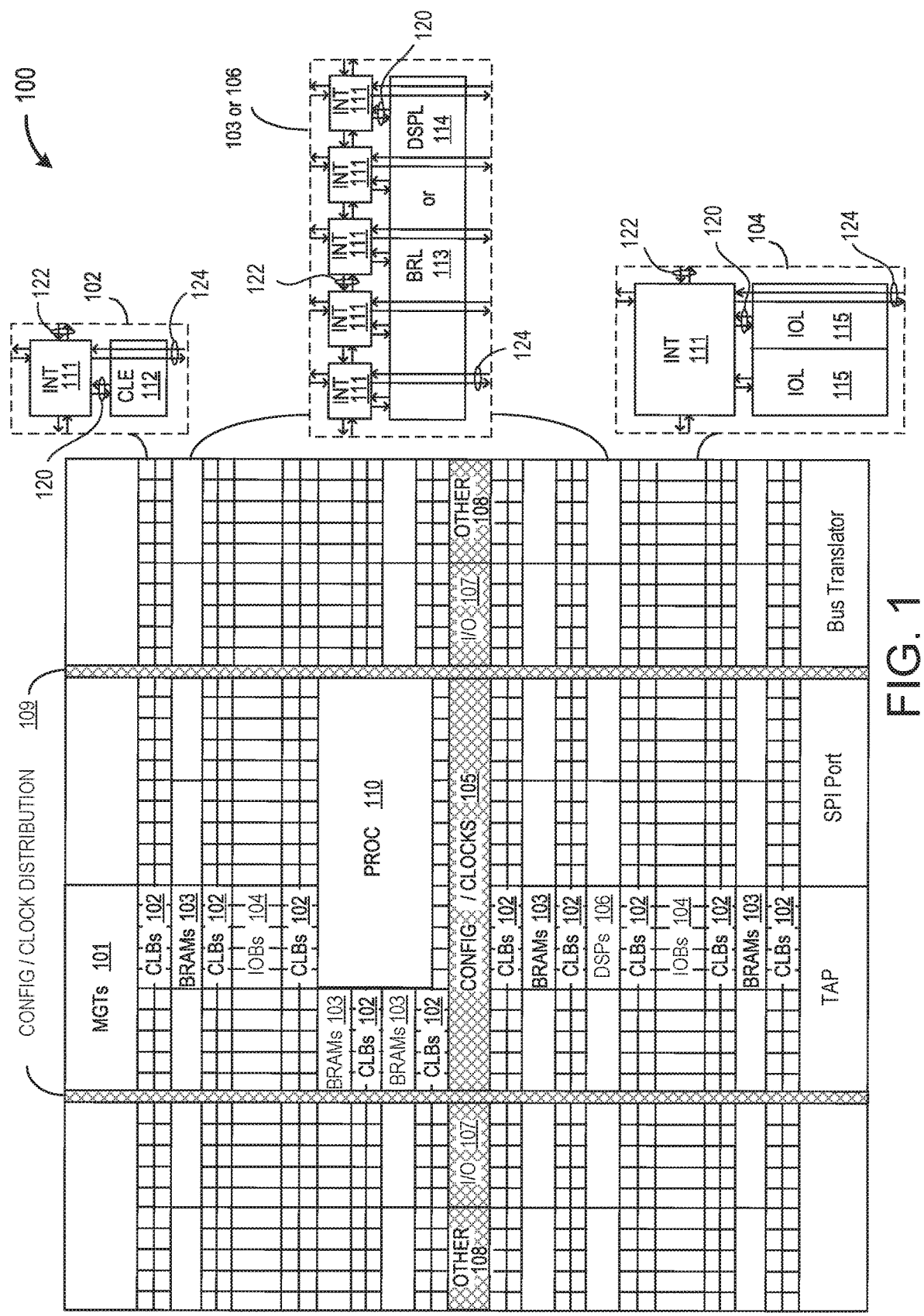
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic).

The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

FPGA applications may be required to support various data communication protocols over wide frequency ranges while using progressively smaller areas. In various examples, a PLL may be used in MGTs to generate an output signal whose phase is related to the phase of an input signal. The frequency of signals generated by the PLL may depend on the resonant frequency of, for example, an inductor-capacitor (LC) circuit (which may also be referred to as an "LC tank circuit") inside a voltage-controlled oscillator (VCO) of the PLL. Inaccurate (e.g., over-simplified) modeling of circuit inductance as being determined solely on the inductor may manifest itself into inaccurate modeling of VCO behavior over a range of frequencies. By creating a data structure representation that accounts for parasitic inductances associated with segments of conductive paths (also called "legs") that extend between terminals of the inductor (or transformer) and an oscillation drive circuit, frequency behavior of frequency generator circuits, such as, LC VCO and/or TC VCO may be more accurately predicted by simulation.

Figure 2A:
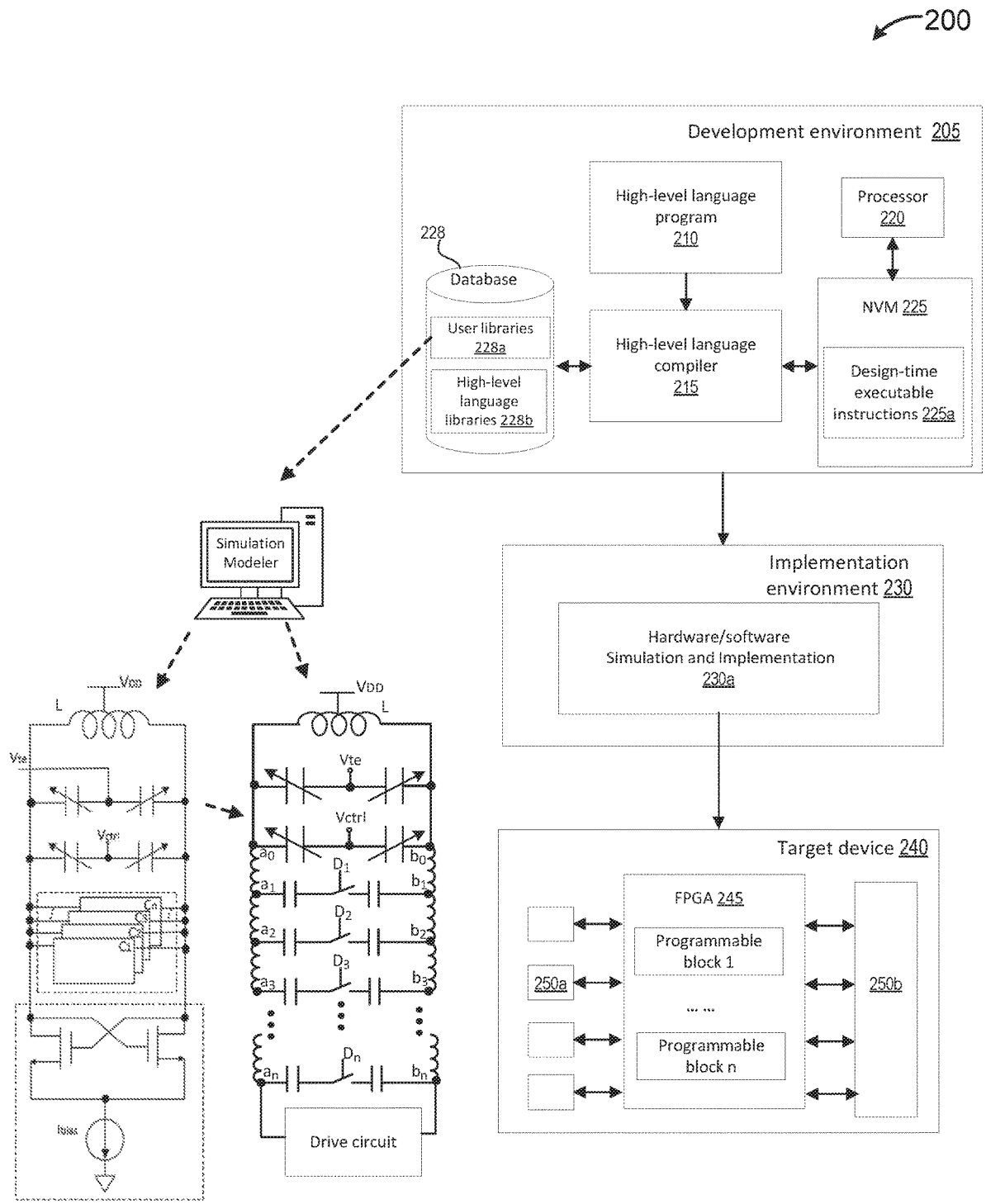
FIG. 2A depicts a block diagram of an exemplary system including a development environment, an implementation environment, and a target device, the system implementing modeling parasitic inductances of an inductor or a transformer in an IC.

FIG. 2A depicts a block diagram of an exemplary system including a development environment, an implementation environment, and a target device, the system implementing modeling parasitic inductances of an inductor or a transformer in an IC. A system 200 includes a development environment 205. The development environment 205 may be a software suite (such as the VIVADO® Suite computer software, commercially available from Xilinx, Inc. of California). The development environment 205 includes a high-level language program 210, such as HDL code, that is used for designing hardware systems. The program 210 may be compiled by a high-level language compiler 215, for example.

The development environment 205 may be running on a processor 220 operably coupled to a non-volatile memory (NVM) 225. In this depicted figure, the NVM 225 contains instructions (e.g., computer program code) that, when executed by the processor 220, cause the processor 220 to perform operations that enable the various tools and functionality of the environment 205. For example, the NVM 225 may include design-time executable instructions 225a that includes various programs, routines, and/or operations that are executed during design time for configuration files that may be used, for example, to program (e.g., as programmable logic) or design (e.g., hard block circuits in an ASIC) for a target device.

The development environment 205 also includes at least one database 228. The database 228 includes user libraries 228a and high-level libraries 228b, for example. The user libraries 228a may include a list of circuit models that may be used to form a phase-locked-loop (PLL), for example. In an illustrative example, the PLL may be a delta-sigma PLL (not shown) having a voltage-controlled oscillator (VCO). In some embodiments, the user may be able to select whether to use an LC VCO or a TC VCO, for example. The user libraries 228a may also include, in some embodiments, circuit parameter information that may be used to determine specific circuit design parameters. In some implementations, placement and routing may be predetermined according to a pre-defined circuit element (e.g., LC VCO or TC VCO block). Associated with such a pre-defined circuit element maybe circuit parameter information from which specific circuit parasitic parameters may be determined. As will be described in further detail with reference to FIGS. 6A-6B, various implementations may receive circuit parameter information stored in the user libraries 228a, for example, to determine parasitic inductance values in segments of the conductive path(s) (also referred to as "legs") that connect a main coil (e.g., transformer or inductor) to an oscillation drive circuit.

In some implementations, placement and routing for the elements of a frequency generator circuit may not be pre-determined according to a pre-defined circuit element. In such implementations, circuit parameter information may be determined at a later stage in the design process, such as after placement and routing of the conductive paths and the components, including, for example, a main inductor (e.g., transformer or inductor), one or more selectable capacitors, and an oscillation drive circuit. The user library 228a may be updated to include circuit parameter information, once it becomes available for a specific design.

For an LC VCO and/or a TC VCO, the circuit parameter information may include, for example, material properties and spatial properties. By way of example and not limitation, material properties may include, but are not limited to, magnetic permeability, inductance of an inductor, materials of the wirings in the circuit, dielectric constant of the wirings, coupling coefficient K of a transformer, resistance of different portions of the conductive paths, or any of the foregoing taken alone or in combination. Also by way of example and not limitation, spatial properties may include, but are not limited to relative positions of the components, magnetic field shape, position of an inductor, position and number of connection nodes between the inductor and each of the capacitor arrays, length and thickness of the conductive path segments between adjacent nodes of the inductor and the connection nodes, cross-coupling effects or any of the foregoing taken alone or in combination.

The system 200 further includes an implementation environment 230. In some examples, the implementation environment 230 may be packaged with the development environment 205. The implementation environment 230 includes various tools 230a for hardware and/or software simulation, synthesis/regeneration, and/or implementation (e.g., place and route). As an illustrative example, the environment 205 may have an HLL program 210, compile the program 210 using the compiler 215, and then simulate, and/or synthesize, and/or implement the compiled program in the environment 230. After the environment 230 implements the design, the implementation may be loaded onto a target device 240. In some embodiments, user selected circuit (e.g., LC VCO) may be further accurately modeled, for example, by a simulation modeler, by considering parasitic effects (e.g., parasitic inductances of inductor legs) of devices (e.g., inductor or transformer) in the circuit. Thus, the selected circuit may be better designed to meet different design constraints, for example, predicting VCO frequency for a given frequency band.

A target device 240 may, for example, be a system-on-chip (SOC) that includes various components, at least one among them being a field programmable gate array (FPGA) 245. The FPGA 245 may be programmed/configured "on-the-fly" by taking a bitstream of the implementation generated by environments 205 and 230 and writing the bitstream into programmable logic (PL) of the FPGA 245. The device 240 may also include other components, such as signal processing circuitry/IP, networking circuitry/IP, and system controllers, for example. The device 240 includes a number of buffers 250a (e.g., which may form an I/O interface) that connect external signals into the FPGA 245. In the depicted example, the FPGA 245 includes n programmable logic blocks that represent programmable hardware resources available to realize circuitry in accordance with the design specified by, for example, the user-input high-level language programming in the development environment 205. The FPGA 245 also connects with other devices 250b, which may provide a variety of auxiliary functions. An example of a target device 240 is described in further details with reference to FIG. 2B.

Figure 2B:
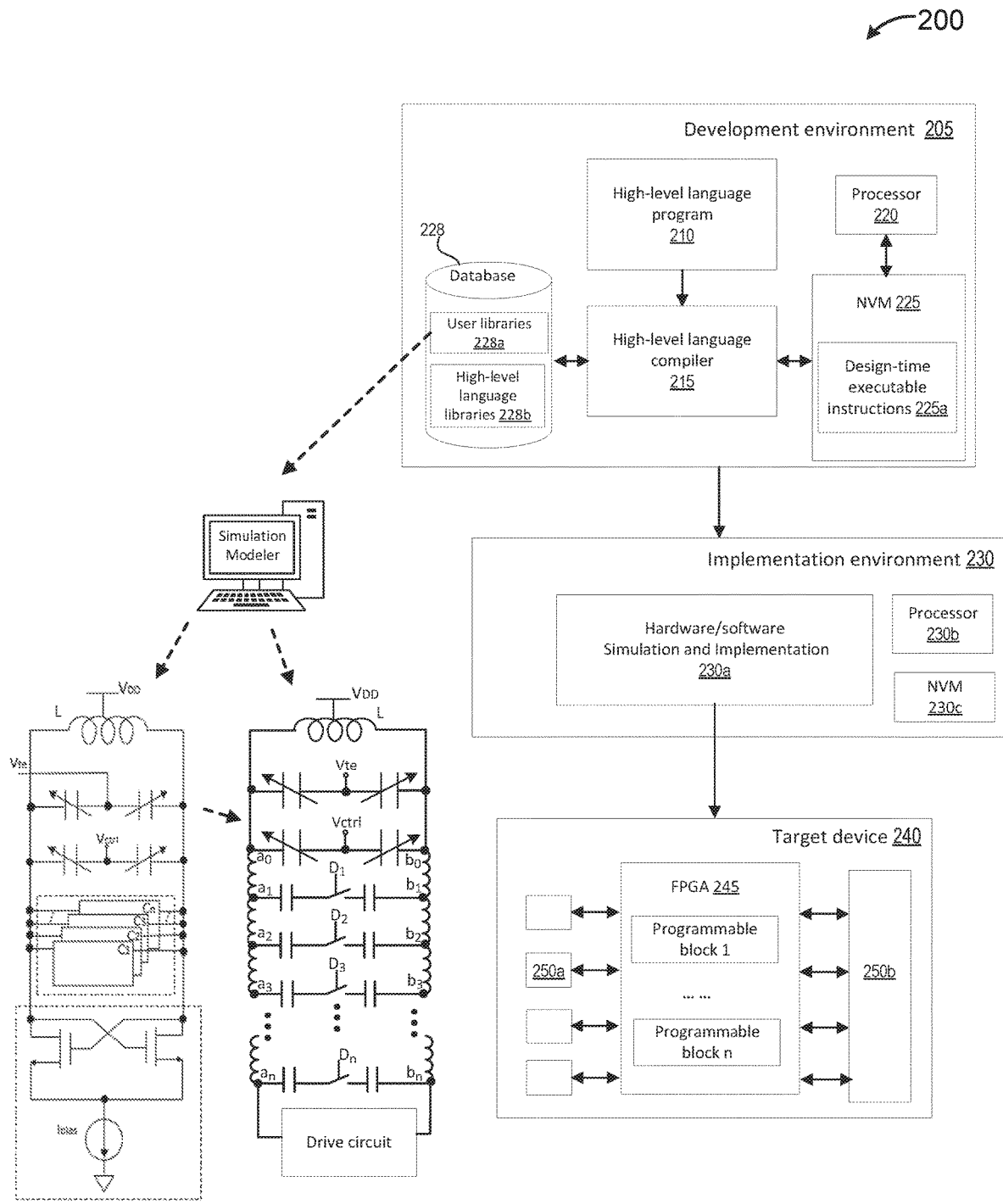
FIG. 2B depicts a block diagram of another exemplary system including a development environment, an implementation environment, and a target device, the system implementing modeling parasitic inductances of an inductor or a transformer in an IC.

FIG. 2B depicts a block diagram of another exemplary system including a development environment, an implementation environment, and a target device, the system implementing modeling parasitic inductances of an inductor or a transformer in an IC. In this depicted example, the implementation environment 230 may be running on a processor 230b operably coupled to a non-volatile memory (NVM) 230c. In this depicted figure, the NVM 230c contains instructions that, when executed by the processor 230b, cause the processor 230b to perform operations that enable the various tools and functionality of the environment 205. For example, the NVM 230c may include computer program code that, when executed by the processor 230b, may generate a data structure representation of an on-chip inductive-capacitive (LC) tank circuit by determining parasitic inductances in each of the segments of conductive paths that connect a main inductor to one or more selectable capacitors.

Figure 2C:
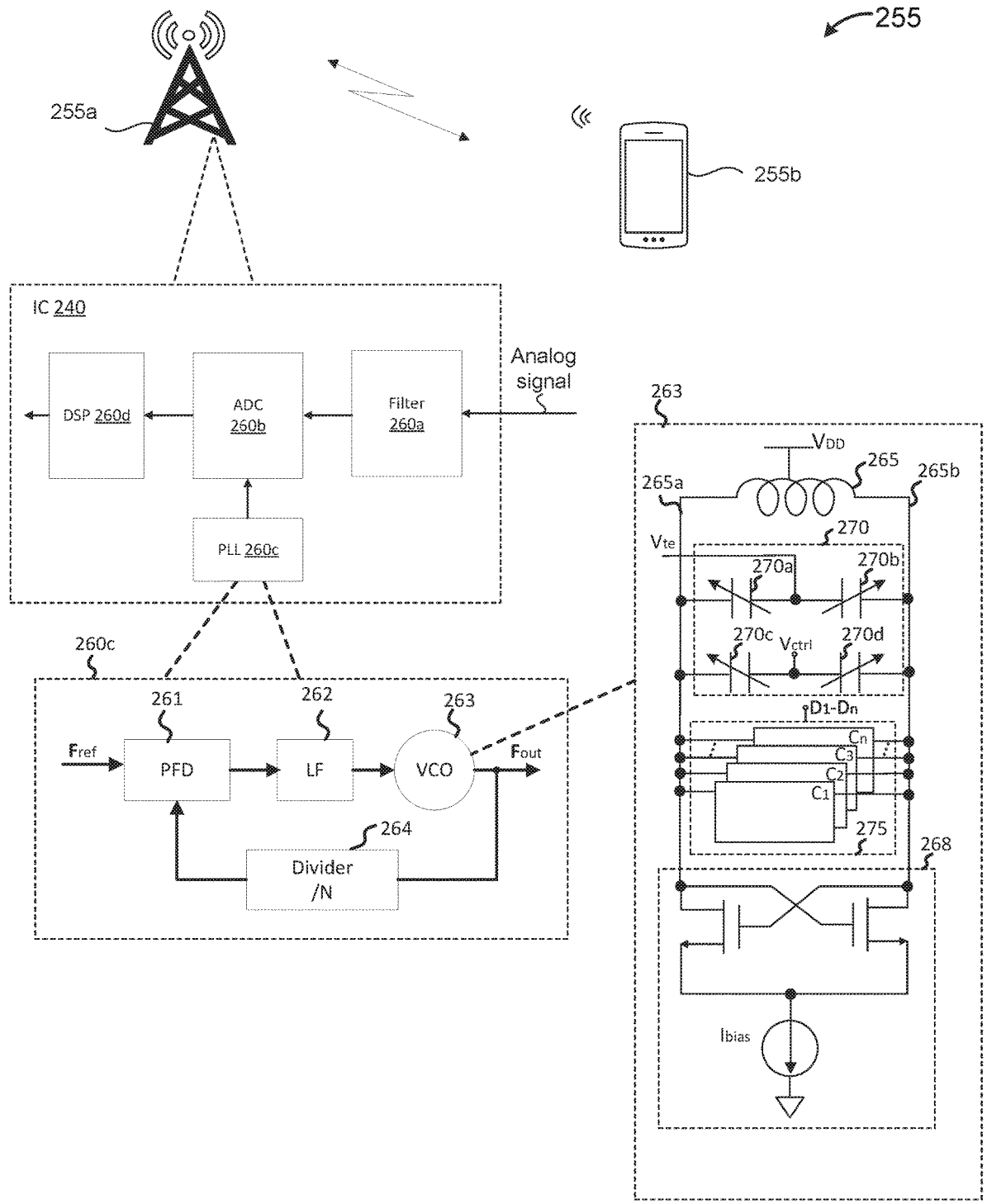
FIG. 2C depicts a voltage-controlled oscillator (VCO) having an exemplary inductor implemented in an IC.

FIG. 2C depicts a voltage-controlled oscillator (VCO) having an exemplary inductor implemented in an IC. In this depict example, a communication system 255 includes a base station 255a, which may be used to transmit and receive data from some data communication devices. In this exemplary example, the base station 255a receives analog signals from a portable communication device 255b (e.g., cell phone). The base station 255a includes the target device 240 (e.g., IC 240) to process data communications through an antenna between the base station 255a and the cell phone 255b. The IC 240 includes a filter 260a to filter incoming analog signal, and one or more analog-to-digital converters (ADCs) 260b that sample and convert analog signals into digital signals. The sampling and conversion may be controlled by different clock signals. The clock signals may be generated by a phase-locked-loop (PLL) 260c and then processed by a digital signal processor (DSP) 260d, for example. In some embodiments, the IC 240 may also include one or more digital-to-analog converters (DACs) to sample and convert digital signals into analog signals. The sampling and converting of the DACs may also be controlled by clock signals generated by the PLL 260c. The PLL 260c may also be used to provide clock signals to other functional blocks (e.g., flip flops).

In this illustrative example, the PLL 260c includes a phase-frequency detector (PFD) 261, a low-pass filter (LF) 262, a voltage-controlled oscillator (VCO) 263 and an N-fold digital divider 264. The PFD 261 compares positive-going edges of a clock signal to those from the N-fold digital divider 264 and drives the LF 262 with current pulses whose widths are proportional to the phase difference between the two signals. The pulses are low-pass filtered by the LF 262 and the resulting waveform drives the VCO 263. The PLL 260c may use the VCO 263 to generate continuous frequency coverage from 7.4 to 14 GHz, for example.

In this depicted example, VCO 263 is an LC VCO. The LC VCO 263 includes an inductor 265. A first terminal of the inductor 265 is connected to a first terminal of a drive circuit 268 to form a first conductive path 265a. A second terminal of the inductor 265 is connected to a second terminal of the drive circuit 268 to form a second conductive path 265b. The LC VCO 263 also includes several capacitive paths arranged between the first conductive path 265a and the second conductive path 265b. The total inductance of the inductor 265 is not considered as a fixed value of the main coil of the inductor 265. Rather, parasitic inductances of two legs of the inductor 265 are also considered. By modeling leg distribution effect of inductors, frequencies of LC VCOs may be more accurately predicted to meet many design constraints such as, for example, frequency range, frequency band overlap, temperature compensations, mode overlap, and phase noise. An exemplary circuit schematic representation with inductor and capacitor arrays is described in further detail with reference to FIG. 3B.

In this depicted example, the LC VCO 263 includes a varactor block 270 and a switched-capacitor (SC) block 275. The varactor block 270 includes a first variable capacitor (varactor) 270a. A first terminal of the first varactor 270a is connected to the first conductive path 265a and a second terminal of the first varactor 270a is connected to a second varactor 270b. The other terminal of the second varactor 270b is connected to the second conductive path 265b. The common node of the first varactor 270a and the second varactor 270b is controlled by a temperature compensation voltage $V_{te}$ to ensure that the VCO 263 stays within the same coarse frequency band when temperature drifts after an initial coarse frequency band tuning. The $V_{te}$ voltage may be proportional to the temperature and may be RC-filtered to limit noise contribution to the LC VCO 263.

The varactor block 270 also includes a third varactor 270c. A first terminal of the third varactor 270c is connected to the first conductive path 265a and a second terminal of the third varactor 270c is connected to a fourth varactor 270d. The other terminal of the fourth varactor 270d is connected to the second conductive path 265b. The common node of the third varactor 270c and the fourth varactor 270d is connected to a control voltage $V_{ctrl}$. The control voltage $V_{ctrl}$ may be varied arbitrarily to control capacitance. The control voltage $V_{ctrl}$ may be used for varying linearly the equivalent capacitance of the third varactor 270c and the fourth varactor 270d. In this depicted example, the varactor block 270 only includes four varactors 270a, 270b, 270c, and 270d. In some other implementations, the varactor block 270 may include the first varactor 270a, the second varactor 270b, and a number of (e.g., 6, 10, 12, for example) parallel-connected multi-fingered N-type metal-oxide-semiconductor (NMOS) varactors.

The switched-capacitor (SC) block 275 is used to coarse tune frequency calibration to widen operating frequency range. The switched-capacitor block 275 includes N slices of capacitor arrays (N≥1). Each slice of the N slices of capacitor arrays may be enabled or disabled by using a corresponding controlling signal (e.g., a digital signal $D_1, \ldots D_n$) to control a switch arranged in the corresponding slice. An example of a switched-capacitor (SC) block architecture is described in further detail with reference to FIG. 3. Coupled to the legs 265a, 265b is the drive circuit 268. The drive circuit 268 includes two cross-coupled transistors. The two cross-coupled transistors, in this example, have their respective drains connected to the respective first and second legs and to each other's gates. Each transistor's sources are connected together, and to a current sink $I_{bias}$ (e.g., a constant current source). The current source may be adjustable (not shown) to enable the current sink $I_{bias}$ to generate a range of bias current values. In some embodiments, the LC-VCO 263 may adjust its power consumption in response to an $I_{bias}$ control signal, for example, to controllably adjust power consumption.

Figures 3A, 3B:
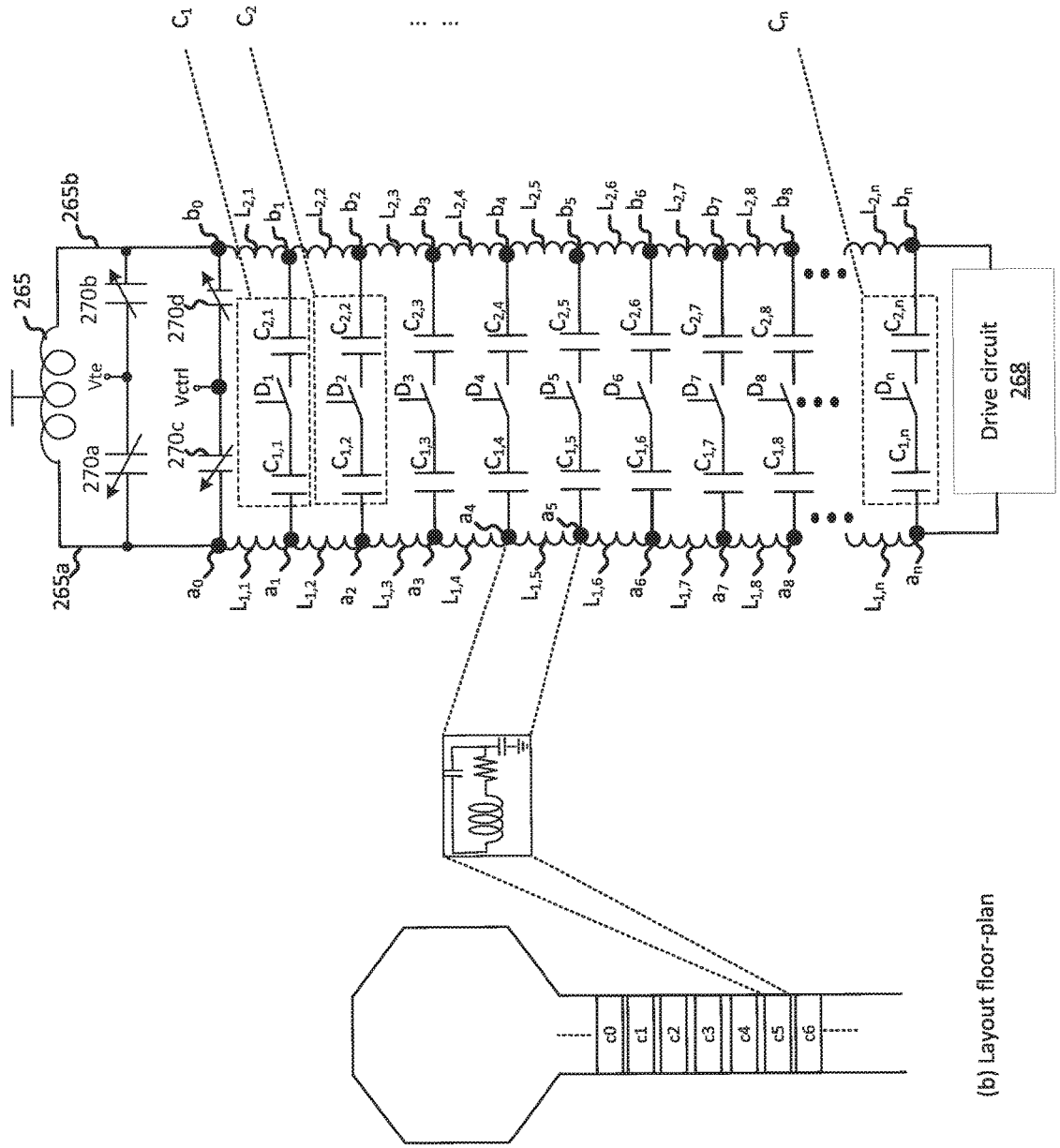
FIG. 3A depicts an exemplary layout floor plan of an inductor used in the LC VCO of FIG. 2B.
FIG. 3B depicts a schematic of an exemplary inductor and capacitor array model of the LC VCO of FIG. 2B.

FIG. 3A depicts an exemplary layout floor plan of an inductor used in the LC VCO of FIG. 2B. The layout of the LC VCO is designed in accordance with symmetry, which may reduce the effects of parasitic parameters. The varactor block 270 and the capacitor arrays C1-Cn of the switched-capacitor block 275 are placed between the inductor coil legs in the layout. In some embodiments, the units of different binary bits used to control each slice C1-Cn of the switched capacitor block 275 may be distributed as, for example, a common centroid to mitigate inductor-leg distribution effect. In some embodiments, the layout of the LC VCO may be designed to be non-common centroid inter-digitalized capacitor array floor plan used to maximize the frequency range of VCOs.

FIG. 3B depicts a schematic of an exemplary inductor and capacitor array model of the LC VCO of FIG. 2B. A schematic view of exemplary parasitic inductances of two legs (two conductive paths) of the inductor 265 is illustrated. The varactor block 270 is connected to the first conductive path 265a through a node $a_0$ and is connected to the second conductive path 265b through a node $b_0$. Each capacitor array of the switched-capacitor block 275 is connected, through a first corresponding connecting node $a_i$ (e.g., $a_1$, $a_2$, $a_3$, ..., $a_n$) to the first conductive path 265a and, through a second corresponding connecting node $b_i$ (e.g., $b_1$, $b_2$, $b_3$, ..., $b_n$), to the second conductive path 265b, i≥1. Wiring path between node $a_0$ and $a_i$ will introduce a first corresponding parasitic inductance $L_{1,i}$, and wiring path between node $b_0$ and $b_i$ will introduce a second corresponding parasitic inductance $L_{2,i}$ when a corresponding capacitor array is enabled by, for example, a corresponding digital signal $D_i$ (e.g., $D_1$, $D_2$, $D_3$, ..., $D_n$).

Each of the first corresponding parasitic inductance $L_{1,i}$ and the second corresponding parasitic inductance $L_{2,i}$ may be equal to a height of the corresponding capacitor array. A total inductance $L_{total}$ of the LC VCO may be expressed as $$L_{total} = L_{main\ coil} + \sum_{i=1}^{k} L_{par\_i}, 1 \le k \le n.\ L_{par\_i}$$

is the total parasitic inductances. For example, when a first capacitor array $C_1$ and a second capacitor array $C_2$ are enabled, a total inductance $L_{total}$ may be equal to a fixed inductance $L_{main\ coil}$ of the main coil of the inductor 265 plus parasitic inductances $L_{1,1}$ and $L_{1,2}$ of the first conductive path 265a, and parasitic inductances $L_{2,1}$ and $L_{2,2}$ of the second conductive path 265b. Thus, the inductor 265 may be modelled as a multi-port inductor. In this depicted example, both parasitic capacitance and parasitic resistance are also modelled with the distributed model.

The parasitic inductances may be obtained in various ways. For example, inductance may be calculated by measuring a voltage difference across a corresponding portion of the leg (e.g., two nodes in the first conductive path 265a) and the rate of change of current in the portion of the leg. Some inductances testing instrument may also be used to obtain the parasitic inductances. Data structures (e.g., look-up tables, netlists) may be then generated to represent corresponding parasitic inductances in response to one or more enabled capacitor arrays. The data structure may be used in the future by directly retrieving a corresponding parasitic inductance value from the data structures.

Figure 4:
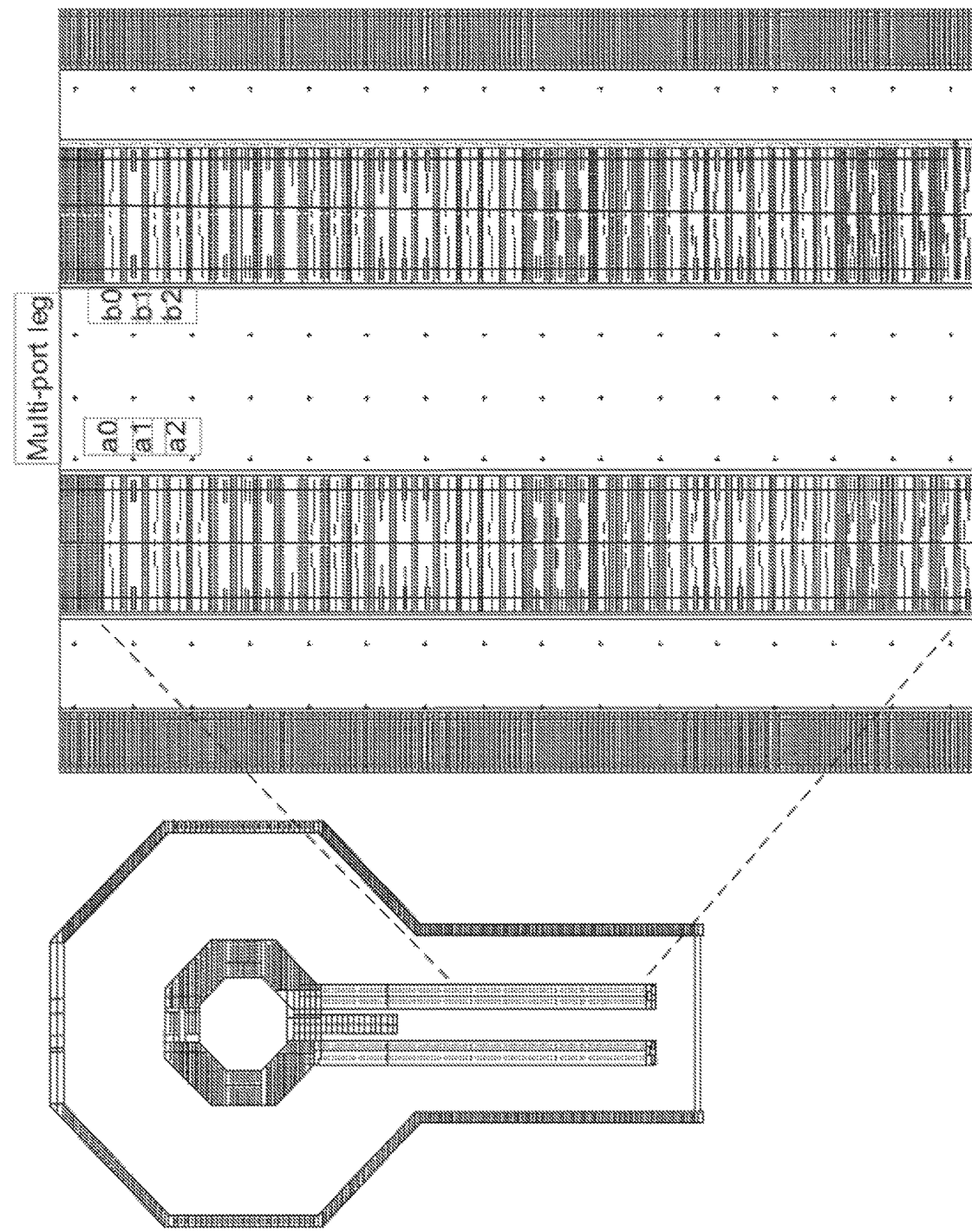
FIG. 4 depicts an exemplary distributed model of an inductor.

FIG. 4 depicts an exemplary distributed model of an inductor. As shown in this figure, the two legs (the two conductive paths) of the inductor are simulated as multi-port legs with corresponding parasitic inductances. A computer program product embodied on a non-transitory computer readable medium may include computer code used to simulate the multi-port inductor to generate data structures representing corresponding parasitic inductances. For example, a look-up table may be then formed to include a relationship between each node $a_i$, $b_i$, and a corresponding parasitic inductance. In some embodiments, the data structure may be arranged as a netlist associated with nodes $a_i$, $b_i$. By modeling leg distribution effects of the inductor, frequencies of the LC VCO may be more accurately predicted to meet many design constraints such as frequency range, frequency band overlap, temperature compensations, mode overlap, and phase noise, etc.

Figure 5A:
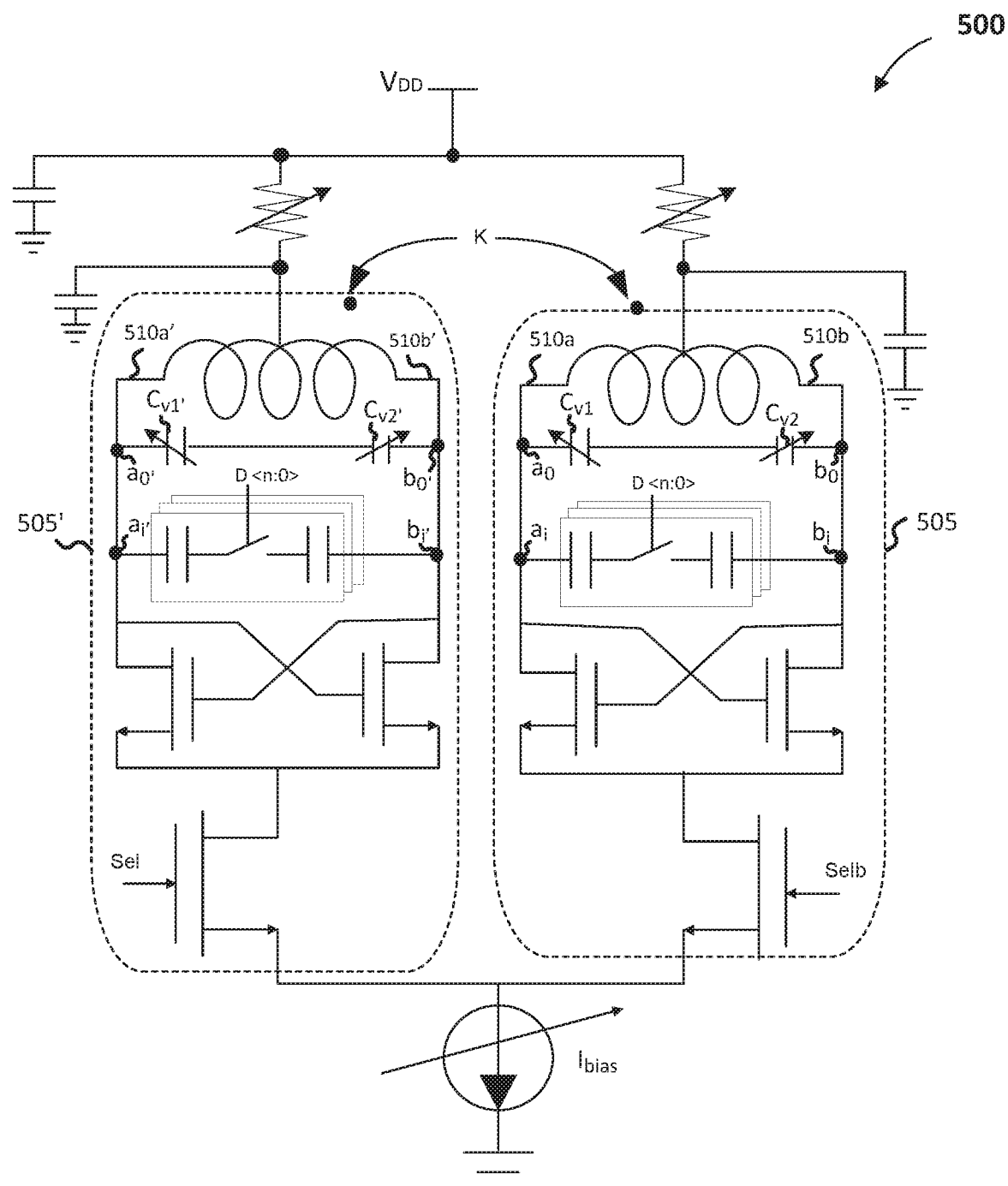
FIG. 5A depicts a schematic view of an exemplary transformer-capacitor (TC) VCO.

FIG. 5A depicts a schematic view of an exemplary transformer-capacitor (TC) VCO. A dual-mode TC VCO 500 includes two copies of circuits 505, 505'. The two circuits share a voltage source $V_{DD}$ and a current source $I_{bias}$. Each copy of circuits 505, 505' may be enabled or disabled by a corresponding selection signal (e.g., Sel signal for circuit 505', and Selb signal for circuit 505). The corresponding selection signals may be used to change the working mode of the TC VCO 500.

Each copy of circuits 505, 505' includes a varactors block (e.g., $C_{v1}$, $C_{v1'}$, $C_{v2}$, $C_{v2'}$). Each varactors block connects to a first conductive path 510a (or 510a') through a node $a_0$ (or $a_{0'}$) and connects to a second conductive path 510b (or 510b') through a node $b_0$ (or $b_{0'}$). Each copy of circuits 505, 505' also includes a switched-capacitor (SC) block controlled by digital controlling signals $D_i$, and each capacitor array of the SC block may have two nodes $a_i$ and $b_i$ (or $a_{i'}$ and $b_{i'}$) connected to a first conductive path 510a (or 510a') and a second conductive path 510b (or 510b'). As described before, each of two inductors in the TC VCO may also be modelled as multi-port inductors by considering parasitic inductances of legs of the two inductors.

Figure 5C:
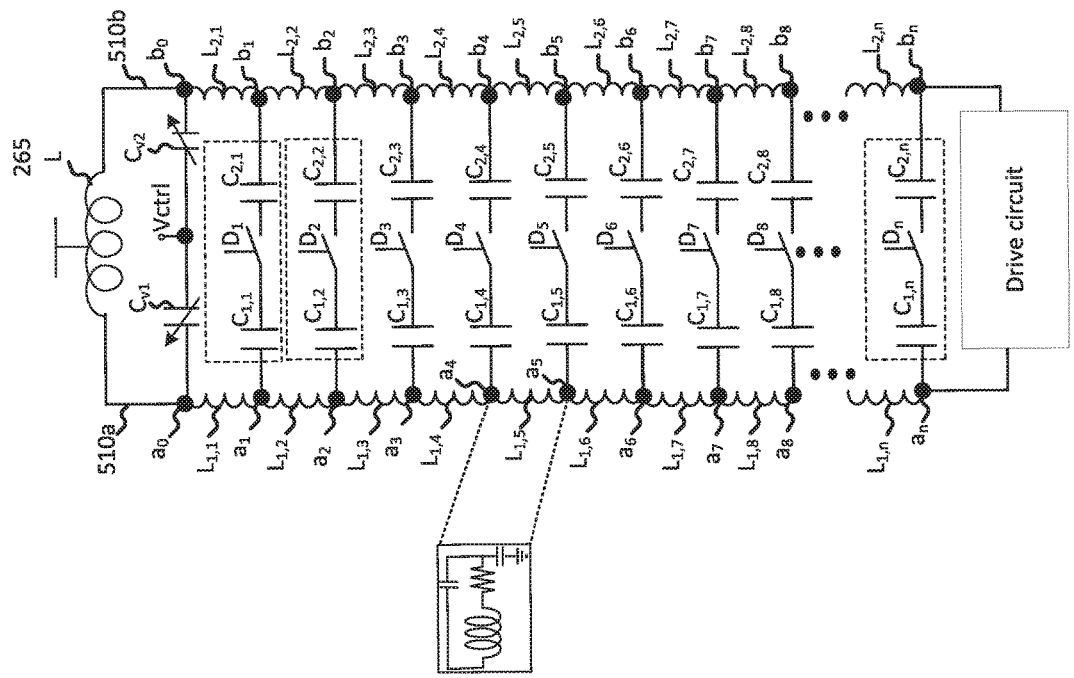
FIG. 5C depicts a schematic of an exemplary inductor and capacitor array model of the TC VCO of FIG. 5A.
Figure 5B:
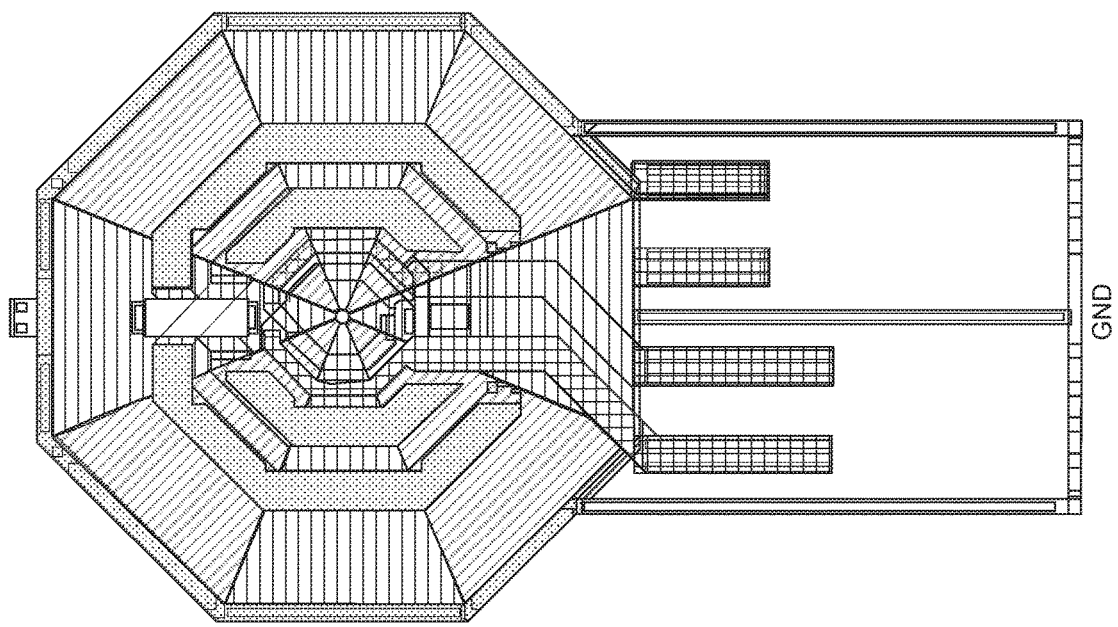
FIG. 5B depicts an exemplary layout floor plan of a transformer used in the TC VCO of FIG. 5A.

FIG. 5B depicts an exemplary layout floor plan of a transformer used in the TC VCO of FIG. 5A.

FIG. 5C depicts a schematic of an exemplary inductor and capacitor array model of the TC VCO of FIG. 5A. As shown in FIG. 5C, the varactor block $C_{v1}$, $C_{v2}$ and the capacitor arrays of the switched-capacitor block of the first copy of circuit 505 are placed between the inductor coil legs in the layout. The units of different binary bits used to control each slice of capacitor array may be distributed as a common centroid to mitigate inductor-leg distribution effect. Each capacitor array of the switched-capacitor block is connected, through a first corresponding connecting node $a_i$ (e.g., $a_1$, $a_2$, $a_3$, ... $a_n$) to the first conductive path 510a and, through a second corresponding connecting node $b_i$ (e.g., $b_i$, $b_2$, $b_3$, ... $b_n$), to the second conductive path 510b, i≥1. Wiring path between node $a_0$ and $a_i$ will introduce a first corresponding parasitic inductance $L_{1,i}$, and wiring path between node $b_0$ and $b_i$ will introduce a second corresponding parasitic inductance $L_{2,i}$ when a corresponding capacitor array is enabled by, for example, a corresponding digital signal $D_i$ (e.g., $D_1$, $D_2$, $D_3$, ... $D_n$). Each of the first corresponding parasitic inductance $L_{1,i}$ and the second corresponding parasitic inductance $L_{2,i}$ may be equal to a height of the corresponding capacitor array. A total inductance of the first copy of circuit 505 may be expressed as:

$$L_{total} = L_{main\ coil} + \sum_{i=1}^{k} L_{par\_i},$$

k is the number of selected capacitor arrays, $1 \le k \le n$. $L_{par\_i}$ is the total parasitic inductances. For example, when a first capacitor array $C_1$ and a second capacitor array $C_2$ are enabled, a total inductance may be equal to a fixed inductance L of the main coil of the inductor plus parasitic inductances $L_{1,1}$ and $L_{1,2}$ of the first conductive path 510a, and parasitic inductances $L_{2,1}$ and $L_{2,2}$ of the second conductive path 510b. Thus, the inductor may be modelled as a multi-port inductor. A second copy of circuit 505' may also be modelled in a similar way. FIG. 5(c) shows an exemplary layout of the TC VCO 500.

Figure 6A:
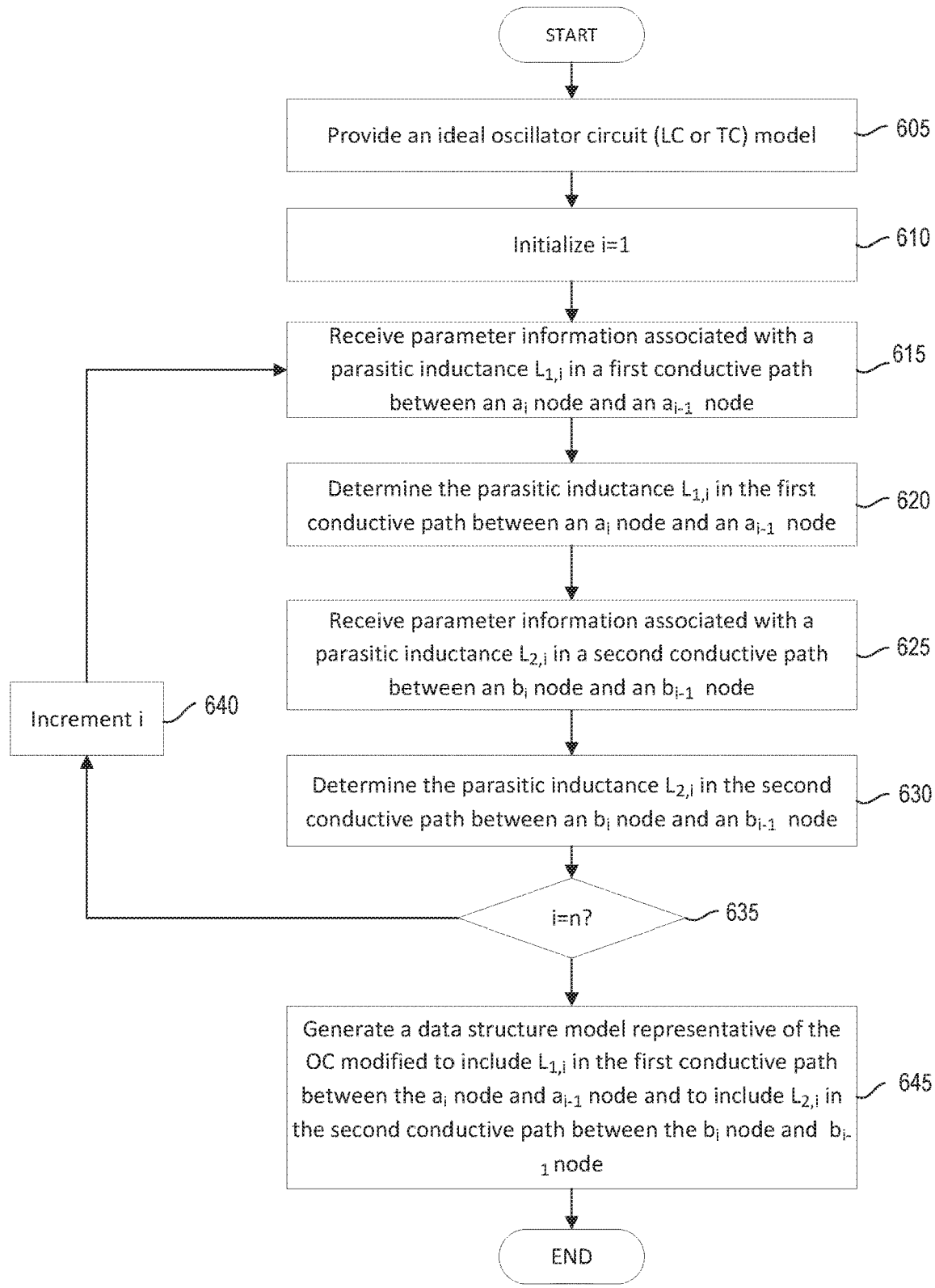
FIG. 6A depicts a flow chart of an exemplary method to model parasitic inductances of an inductor or a transformer in an IC.

FIG. 6A depicts a flow chart of an exemplary method to model parasitic inductances of an inductor or a transformer in an IC. A method to model parasitic inductances of an inductor includes, at 605, providing a circuit model (e.g., circuit 263, circuit 500) representative of an ideal oscillator circuit to a computer program (simulation modeler). The computer program, embodied on a non-transitory computer readable medium, may include computer code used to perform modeling. The ideal oscillator circuit may include an inductor 265, a drive circuit 268, a first conductive path 265a extending between a first terminal of the inductor 265 and a first terminal of the drive circuit 268, and a second conductive path 265b extending between a second terminal of the inductor 265 and a second terminal of the drive circuit 268. The ideal oscillator circuit may also include N selectively connectable capacitor arrays (e.g., switched-capacitor block) 275, that, when selected, provides a corresponding capacitance between the first conductive path 265a at an $a_i$ node and the second conductive path 265b at a $b_i$ node, i≥1. N may be at least 4, for example. Each of the N selectively connectable capacitor arrays 275 may be enabled in response to a corresponding control signal (e.g., Do, ..., $D_r$). Capacitors in the N selectively connectable capacitor arrays 275 may be metal-oxide-metal (MOM) capacitors or metal-oxide-semiconductor field-effect transistor (MOSFET) capacitors, for example.

The method also includes, at 610, by a processor 220/230b, for example, introducing a variable i and initializing i=1. The method also includes, at 615, receiving parameter information associated with a parasitic inductance $L_{1,i}$ in the first conductive path 265a between the $a_i$ node and an $a_{i-1}$ node. The method also includes, at 620, determine the parasitic inductance $L_{1,i}$ in the first conductive path 265a between the $a_i$ node and $a_{i-1}$ node. The method also includes, at 625, receiving parameter information associated with a parasitic inductance $L_{2,i}$ in the second conductive path 265b between the $b_i$ node and a $b_{i-1}$ node. The method also includes, at 630, determining the parasitic inductance $L_{2,i}$ in the second conductive path 265b between the $b_i$ node and $b_{-1}$ node.

The method also includes, at 635, determining, by the processor 220/230b, for example, whether i equals n. n is the number of slices of capacitor arrays 275. If i is not equal to n, then, the method includes, at 640, incrementing i and looping back to 615. If i=n, then, the method includes, at 645, generating a data structure model representative of the OC modified to include $L_{1,i}$ in the first conductive path 265a between the $a_i$ node and $a_{i-1}$ node and to include $L_{2,i}$ in the second conductive path 265b between the $b_i$ node and the $b_{i-1}$ node. Then, the method ends.

Figure 6B:
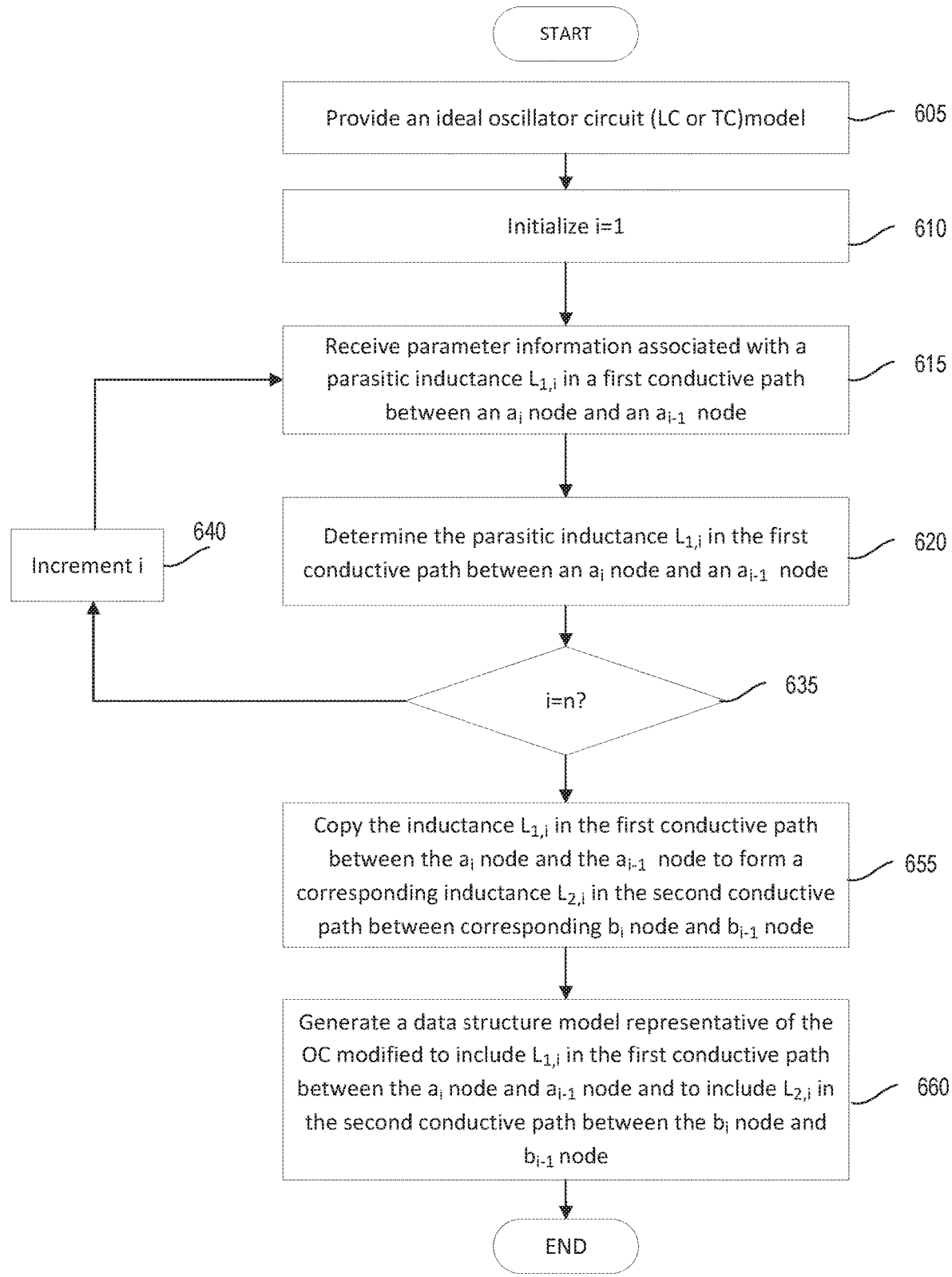
FIG. 6B depicts a flow chart of another exemplary method to model parasitic inductances of an inductor or a transformer in an IC.

FIG. 6B depicts a flow chart of another exemplary method to model parasitic inductances of an inductor or a transformer in an IC. As an LC VCO may be designed symmetric, only one of the parasitic inductances of the two conductive paths may be obtained, and the other parasitic inductances of the other conductive path may be obtained by directly using the obtained parasitic inductances. In this depicted example, the method to model parasitic inductances of an inductor includes, at 605, providing a circuit model (e.g., circuit 263, circuit 500) representative of an ideal oscillator circuit to a computer program. The computer program, embodied on a non-transitory computer readable medium, may include computer code used to perform modeling. The ideal oscillator circuit may include an inductor 265, a drive circuit 268, a first conductive path 265a extending between a first terminal of the inductor 265 and a first terminal of the drive circuit 268, and a second conductive path 265b extending between a second terminal of the inductor 265 and a second terminal of the drive circuit 268. The ideal oscillator circuit may also include N selectively connectable capacitor arrays (e.g., switched-capacitor block) 275, that, when selected, provides a corresponding capacitance between the first conductive path 265a at an $a_i$ node and the second conductive path 265b at a $b_i$ node, i≥1. N may be at least 4, for example. Each of the N selectively connectable capacitor arrays 275 may be enabled in response to a corresponding control signal (e.g., $D_0, \ldots, D_r$). Capacitors in the N selectively connectable capacitor arrays 275 may be metal-oxide-metal (MOM) capacitors or metal-oxide-semiconductor field-effect transistor (MOSFET) capacitors, for example.

The method also includes, at 610, by a processor 220/230b, for example, introducing a variable i and initializing i=1. The method also includes, at 615, receiving parameter information associated with a parasitic inductance $L_{1,i}$ in the first conductive path 265a between the $a_i$ node and an $a_{i-1}$ node. The method also includes, at 620, determine the parasitic inductance $L_{1,i}$ in the first conductive path 265a between the $a_i$ node and $a_{i-1}$ node.

The method also includes, at 635, determining, by the processor 220/230b, for example, whether i equals n. n is the number of slices of capacitor arrays 275. If i is not equal to n, then, the method includes, at 640, incrementing i and looping back to 615. If i=n, then, the method includes, at 655, copying the inductance $L_{1,i}$ in the first conductive path between the $a_i$ node and the $a_{i-1}$ node to form a corresponding inductance $L_{2,i}$ in the second conductive path between corresponding $b_i$ node and $b_{i-1}$ node. The method also includes, at 660, generating a data structure model representative of the OC modified to include $L_{1,i}$ in the first conductive path between the $a_i$ node and $a_{i-1}$ node and to include $L_{2,i}$ in the second conductive path between the $b_i$ node and $b_{i-1}$ node. Then, the method ends. In some embodiments, as a TC VCO (e.g., TC VCO 500) may include two inductors, each inductor, separately, may be modelled in a similar method described in the flow chart.

Figure 7:
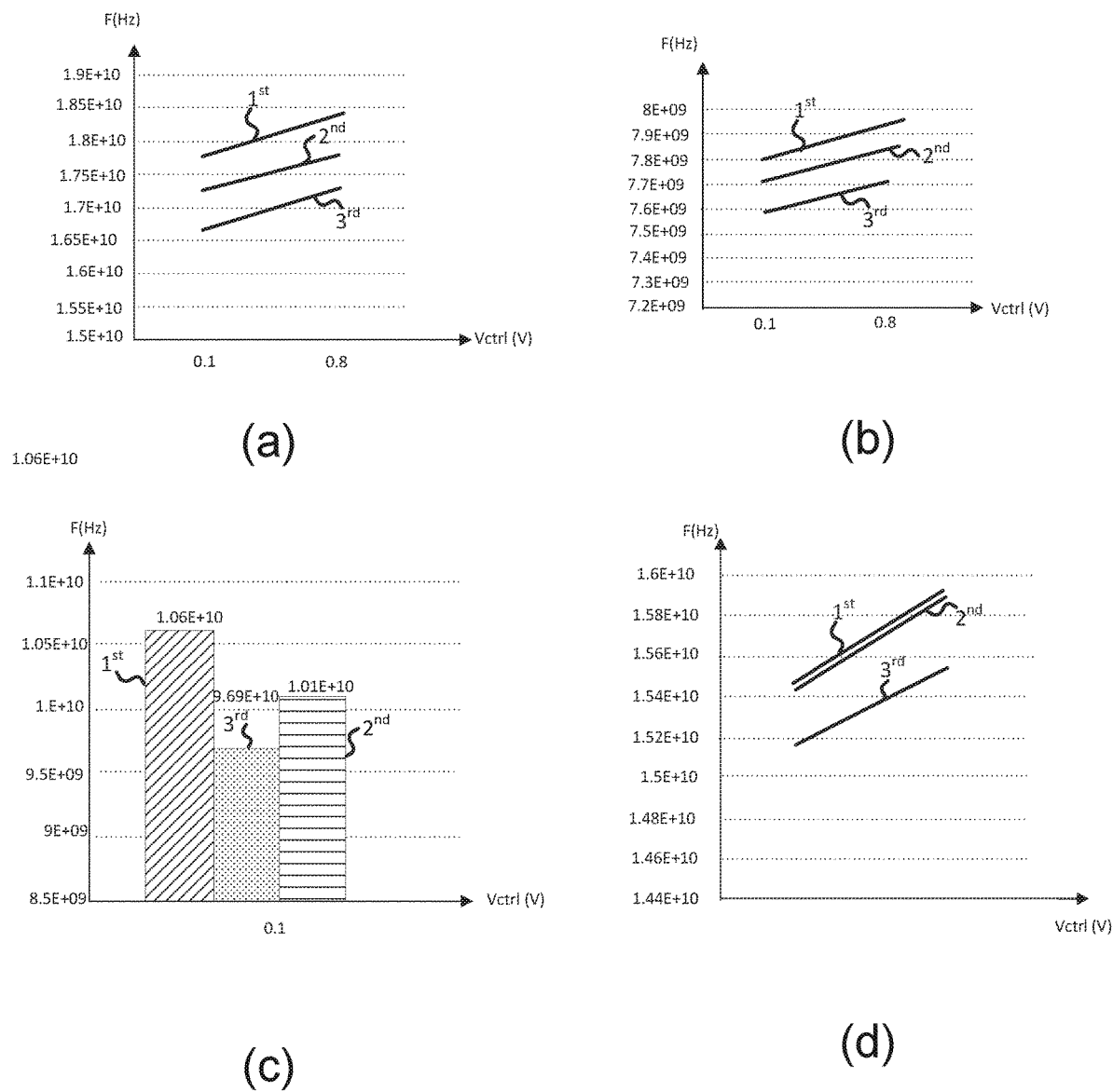
FIG. 7 depicts schematic view of simulation results from different exemplary modeling methods.

FIG. 7 depicts schematic view of simulation results from different exemplary modeling methods. Simulation may be performed under SPICE or other suitable circuit simulation package. In this simulation, maximum frequencies, minimum frequencies, frequency ranges, and frequency band overlap and temperature compensation of different modeling methods are discussed. A first modeling may be ignoring distribution effect and ignoring long legs by putting port locations on $a_0$, $b_0$ in FIG. 3(c). A second modeling may be considering the legs of the inductor as a distributed multi-port inductor (e.g., the model in FIG. 3(c) and FIG. 4(b)). A third modeling may be ignoring the distribution effect and considering long legs by putting port locations on $a_n$, $b_n$ in FIG. 3(c). $a_n$, $b_n$ are positive and negative ports physically located at the end of the inductor/transformer legs.

In FIG. 7(a), the maximum frequency of the $1^{st}$, $2^{nd}$, and $3^{rd}$ modeling are illustrated. The $1^{st}$ modeling, which ignoring both distribution effect and long legs, makes the maximum frequency of a VCO (e.g., the VCO 263) higher than what it really is. The $3^{rd}$ modeling, which ignores the distribution effect and considers long legs by putting port locations on $a_n$, $b_n$, predicts the maximum frequency of a VCO (e.g., the VCO 263) to be lower than what it actually is.

In FIG. 7(b), the minimum frequency of the $1^{st}$, $2^{nd}$, and $3^{rd}$ modeling are illustrated. The $1^{st}$ modeling, which ignores both distribution effect and long legs, predicts the minimum frequency of a VCO (e.g., the VCO 263) to be higher than what it actually is. The $3^{rd}$ modeling, which ignores the distribution effect and considers long legs by putting port locations on $a_n$, $b_n$, predicts the minimum frequency of a VCO (e.g., the VCO 263) to be lower than what it actually is.

In FIG. 7(c), the frequency range of the $1^{st}$, $2^{nd}$, and $3^{rd}$ modeling are illustrated. The simulation results show that the multi-port modeling (the $2^{nd}$ modeling) may provide a PLL range of 10.1 GHz and the fixed modeling (the $1^{st}$ modeling and the $3^{rd}$ modeling) may provide a PLL range of 10.6 GHz, and 9.69 GHz, respectively. The two fixed models are either pessimistic or optimistic.

Accurately modeling frequency band overlap between successive bands may, for example, help a designer choose appropriate varactor size that gives enough tuning range that allows the VCO to substantially reduce or mitigate temperature drift. Oversizing the varactor may overcome the temperature drift requirement, but it may be difficult to meet PLL phase noise and maximum frequency specifications. On the other hand, if the varactor size is small, the PLL may have the opposite effect and fail a functional requirement of staying locked during temperature drift. In various embodiments, multi-port modeling may be used to accurately predict frequency band overlap and thus optimize all system requirements, such as minimum and maximum frequencies, phase noise, and temperature drift compensations. In FIG. 7(d), the frequency band overlap and temperature compensation of the $1^{st}$, $2^{nd}$, and $3^{rd}$ modeling are illustrated. The simulation results show an example of successive frequency bands (band 31 and band 32) with the fixed modeling (the $1^{st}$ modeling and the $3^{rd}$ modeling) and the multi-port modeling (the $2^{nd}$ modeling). The frequency band overlap in the fixed modeling is high (91%) compared to the proposed multi-port modeling (the $2^{nd}$ modeling). By using the multi-port modeling, frequency band overlap may be more accurately predicted, and thus, appropriate varactor size may be selected to make a VCO less sensitive to temperature drift, for example.

Although various embodiments have been described with reference to the figures, other embodiments are possible. For example, various ways may be used to determine the value of the parasitic multi-port inductances. In some embodiments, the inductors and/or transformers used in other ICs may also be modelled according to the same method. Various embodiments may be applied to schematic and/or post-layout extracted netlist simulations, which may use a simulation package (e.g., SPICE).

Although, in this depicted example, the PLL 260c is arranged on the same IC with the ADC 260a, 260b. In another embodiment, the PLL 260c may be implemented in a different IC (e.g., another IC) to generate clock signals.

In some embodiments, the PLL 260c may be implemented as hard block fixed circuitry. For example, an application specific integrated circuit (ASIC) may provide a PLL for generating different clock signals with customized hardware circuitry. An ASIC implementation may, in some implementations, provide for a minimized platform with respect to, for example, power consumption and/or die area.

In some embodiments, some or all of the methods described for preparing a data structure for simulation of the PLL 260c may be implemented in a processor that is configured to execute a set of instructions stored in a data store to control the generation of clock signals. The processor may be arranged on the same integrated circuit, which may be an FPGA, with the ADC 260a. For example, the PLL 260c and the data store may be implemented in a programmable logic block of a system-on-chip (SOC) or implemented in a hard block using fixed circuitry of the SOC, and the ADC 260a may be implemented in another hard block using, for example, fixed circuitry of the SOC.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A method comprising:
   (a) providing a circuit model representative of an oscillator circuit (OC), the OC comprising:
      an inductor;
      a drive circuit;
      a first conductive path extending between a first terminal of the inductor and a first terminal of the drive circuit;
      a second conductive path extending between a second terminal of the inductor and a second terminal of the drive circuit; and,
      N selectively connectable capacitor arrays, that, when selected, provides a corresponding capacitance between the first conductive path at an $a_i$ node and the second conductive path at a $b_i$ node, $i \geq 1$;
   (b) receiving parameter information associated with a parasitic inductance $L_{1,i}$ in the first conductive path between the $a_i$ node and an $a_{i-1}$ node;
   (c) determining the parasitic inductance $L_{1,i}$ in the first conductive path between the $a_i$ node and the $a_{i-1}$ node;
   (d) incrementing i and repeat (b) to (c) until i=N; and, (e) generating a data structure model representative of the OC modified to include $L_{1,i}$ in the first conductive path between the $a_i$ node and an $a_{i-1}$ node.

2. The method of claim 1, further comprising:
(f1) receiving parameter information associated with a parasitic inductance $L_{2,i}$ in the second conductive path between the $b_i$ node and a $b_{i-1}$ node;
(g1) determining the parasitic inductance $L_{2,i}$ in the second conductive path between the $b_i$ node and the $b_{i-1}$ node;
(h1) incrementing i and repeat (b) to (c) until i=N; and,
(i1) updating the data structure model representative of the OC modified to further include $L_{2,i}$ in the second conductive path between the $b_i$ node and the $b_{i-1}$ node.

3. The method of claim 1, further comprising:
(f2) copying the inductance $L_{1,i}$ in the first conductive path between the $a_i$ node and the $a_{i-1}$ node to form a corresponding inductance $L_{2,i}$ in the second conductive path between a corresponding $b_i$ node and $b_{-1}$ node; and,
(g2) updating the data structure model representative of the OC modified to further include $L_{2,i}$ in the second conductive path between the $b_i$ node and $b_{i-1}$ node.

4. The method of claim 1, wherein receiving parameter information further comprises receiving position and inductance of the inductor.

5. The method of claim 1, wherein receiving parameter information further comprises receiving position and number of connection nodes between the inductor and each of the capacitor arrays.

6. The method of claim 1, wherein the data structure is arranged as a netlist associated with nodes.

7. The method of claim 1, wherein each of the N selectively connectable capacitor arrays is enabled in response to a corresponding control signal.

8. The method of claim 1, the inductor comprises at least a portion of a transformer winding.

9. The method of claim 1, wherein the OC further comprises a varactor circuit coupled between the first conductive path and the second conductive path.

10. The method of claim 1, wherein the drive circuit comprises: two cross-coupled transistors, wherein each source terminal of the two cross-coupled transistors is connected to a current control circuit.

11. A system comprising:
(a) a processor;
(b) a first data store coupled to the processor and configured to store circuit models of an oscillator circuit (OC) and parameter information associated with each corresponding circuit model;
(c) a second data store coupled to the processor and containing a program of instructions that, when executed by the processor, cause the processor to perform operations to model frequency characteristics of the OC, the operations comprising:
(c1) receiving a circuit model representative of an oscillator circuit (OC), the OC comprising:
an inductor;
a drive circuit;
a first conductive path extending between a first terminal of the inductor and a first terminal of the drive circuit;
a second conductive path extending between a second terminal of the inductor and a second terminal of the drive circuit; and,
N selectively connectable capacitor arrays, that, when selected, provides a corresponding capacitance between the first conductive path at an $a_i$ node and the second conductive path at a $b_i$ node, i≥1;
(c2) receiving parameter information associated with a parasitic inductance $L_{1,i}$ in the first conductive path between the $a_i$ node and an $a_{i-1}$ node;
(c3) determining the parasitic inductance $L_{1,i}$ in the first conductive path between the $a_i$ node and the $a_{i-1}$ node;
(c4) incrementing i and repeat (c2) to (c3) until i=N; and,
(c5) generating a data structure model representative of the OC modified to include $L_{1,i}$ in the first conductive path between the $a_i$ node and an $a_{i-1}$ node.

12. The system of claim 11, wherein the operations further comprising:
(d1) receiving parameter information associated with a parasitic inductance $L_{2,i}$ in the second conductive path between the $b_i$ node and a $b_{i-1}$ node;
(e1) determining the parasitic inductance $L_{2,i}$ in the second conductive path between the $b_i$ node and the $b_{i-1}$ node;
(f1) incrementing i and repeat (d1) to (e1) until i=N; and,
(g1) updating the data structure model representative of the OC modified to include $L_{2,i}$ in the second conductive path between the $b_i$ node and the $b_{i-1}$ node.

13. The system of claim 11, wherein the operations further comprising:
(d2) copying the inductance $L_{1,i}$ in the first conductive path between the $a_i$ node and the $a_{i-1}$ node to form a corresponding inductance $L_{2,i}$ in the second conductive path between a corresponding $b_i$ node and $b_{i-1}$ node; and,
(e2) updating the data structure model representative of the OC modified to further include $L_{2,i}$ in the second conductive path between the $b_i$ node and $b_{i-1}$ node.

14. The system of claim 11, wherein receiving parameter information further comprises receiving position and inductance of the inductor.

15. The system of claim 11, wherein receiving parameter information further comprises receiving position and number of connection nodes between the inductor and each of the capacitor arrays.

16. The system of claim 11, wherein the data structure is arranged as a netlist associated with nodes.

17. The system of claim 11, wherein each of the N selectively connectable capacitor arrays is enabled in response to a corresponding control signal.

18. The system of claim 11, wherein the inductor comprises at least a portion of a transformer winding.

19. The system of claim 11, wherein the OC further comprises a varactor circuit coupled between the first conductive path and the second conductive path.

20. The system of claim 11, wherein the drive circuit comprises: two cross-coupled transistors, wherein each source terminal of the two cross-coupled transistors is connected to a current control circuit.

\* \* \* \* \*

UNITED STATES PATENT AND TRADEMARK OFFICE
CERTIFICATE OF CORRECTION

PATENT NO. : 10,715,153 B1
APPLICATION NO. : 16/517103
DATED : July 14, 2020
INVENTOR(S) : Adebabay M. Bekele et al.

It is certified that error appears in the above-identified patent and that said Letters Patent is hereby corrected as shown below:

In the Specification

Column 4, Line 66, delete "a;" and insert -- $a_i$ --, therefor.

Column 9, Line 65, delete "265$b_i$." and insert -- 2465b. --, therefor.

Column 12, Line 15, delete "$b_i$," and insert -- $b_1$, --, therefor.

Column 12, Line 65, delete "Do," and insert -- $D_0$, --, therefor.

Column 12, Line 66, delete "$D_r$)." and insert -- $D_n$). --, therefor.

Column 13, Line 16, delete "$b_{-1}$" and insert -- $b_{i-1}$ --, therefor.

Column 13, Line 53, delete "$D_r$)." and insert -- $D_n$). --, therefor.

In the Claims

Column 17, Line 20, In Claim 3, delete "$b_{-1}$" and insert -- $b_{i-1}$ --, therefor.

Signed and Sealed this
Eighth Day of June, 2021

Drew Hirshfeld
*Performing the Functions and Duties of the
Under Secretary of Commerce for Intellectual Property and
Director of the United States Patent and Trademark Office*